(12) United States Patent
Liu et al.

(10) Patent No.: US 11,781,222 B2
(45) Date of Patent: Oct. 10, 2023

(54) LAYERED POLYCRYSTALLINE LEAD SELENIDE PHOTOELECTRIC FILM AND FABRICATION METHOD THEREOF

(71) Applicant: Jiangsu University, Jiangsu (CN)

(72) Inventors: Guiwu Liu, Jiangsu (CN); Junlin Liu, Jiangsu (CN); Yuan Zhu, Jiangsu (CN); Guanjun Qiao, Jiangsu (CN); Xiangzhao Zhang, Jiangsu (CN); Quanjiang Lv, Jiangsu (CN); Haigang Hou, Jiangsu (CN); Jian Yang, Jiangsu (CN)

(73) Assignee: Jiangsu University, Jiangsu (CN)

( * ) Notice: Subject to any disclaimer, the term of this patent is extended or adjusted under 35 U.S.C. 154(b) by 0 days.

(21) Appl. No.: 17/639,328

(22) PCT Filed: Mar. 25, 2021

(86) PCT No.: PCT/CN2021/082884
§ 371 (c)(1),
(2) Date: Feb. 28, 2022

(87) PCT Pub. No.: WO2022/198540
PCT Pub. Date: Sep. 29, 2022

(65) Prior Publication Data
US 2022/0396879 A1    Dec. 15, 2022

(30) Foreign Application Priority Data

Mar. 22, 2021 (CN) .......................... 202110302121.1

(51) Int. Cl.
*C23C 18/02* (2006.01)
*C23C 18/04* (2006.01)
(Continued)

(52) U.S. Cl.
CPC .......... *C23C 18/1225* (2013.01); *C23C 18/04* (2013.01); *C23C 18/1204* (2013.01);
(Continued)

(58) Field of Classification Search
CPC . C23C 18/1225; C23C 18/04; C23C 18/1204; C23C 18/1245; C23C 18/1295;
(Continued)

(56) References Cited

U.S. PATENT DOCUMENTS

2021/0282663 A1* 9/2021 Jiang ................... G01N 21/3504

FOREIGN PATENT DOCUMENTS

CN        101429679        5/2009
CN        101871097        10/2010
(Continued)

OTHER PUBLICATIONS

ENG translation from Search of CN-112531065-A (Year: 2023).*
(Continued)

*Primary Examiner* — Alicia J Weydemeyer
*Assistant Examiner* — Laura B Figg
(74) *Attorney, Agent, or Firm* — JCIPRNET

(57) ABSTRACT

The present invention relates to a photoelectric film and a fabrication method thereof, and in particular, to a layered polycrystalline lead selenide (PbSe) film and a fabrication method thereof. The fabrication method mainly includes: (1) fabricating a dense PbSe layer on a substrate through chemical bath deposition (CBD); (2) fabricating a loose plumbonacrite ($Pb_{10}O(OH)_6(CO_3)_6$) layer on the dense PbSe layer through CBD; (3) placing a sample with the dense PbSe layer and the $Pb_{10}O(OH)_6(CO_3)_6$ layer in a selenium ion-containing solution to allow an ion exchange reaction to finally form the layered polycrystalline PbSe film. The fabrication method has the advantages of simple process, low cost, and high controllability. The PbSe film (Continued)

fabricated by the method is composed of a lower dense polycrystalline cubic PbSe layer and an upper loose polycrystalline cubic PbSe layer, which can be widely used in the fabrication of components in the field of photoelectric conversion or thermoelectric conversion, such as infrared (IR) sensors, solar cells, laser emitters, and thermoelectric converters.

9 Claims, 4 Drawing Sheets

(51) Int. Cl.
  *H01L 31/032* (2006.01)
  *H01L 31/0368* (2006.01)
  *H01L 31/18* (2006.01)
  *C23C 18/12* (2006.01)

(52) U.S. Cl.
  CPC ...... *C23C 18/1245* (2013.01); *C23C 18/1295* (2013.01); *H01L 31/0324* (2013.01); *H01L 31/0368* (2013.01); *H01L 31/18* (2013.01)

(58) Field of Classification Search
  CPC .. H01L 31/0324; H01L 31/0368; H01L 31/18
  See application file for complete search history.

(56) References Cited

FOREIGN PATENT DOCUMENTS

| | | | |
|---|---|---|---|
| CN | 104900744 | | 9/2015 |
| CN | 109721036 | | 5/2019 |
| CN | 110299430 | | 10/2019 |
| CN | 112017945 | | 12/2020 |
| CN | 112531065 | | 3/2021 |
| CN | 112531065 A | * | 3/2021 |
| DE | 102013105462 | | 12/2014 |

OTHER PUBLICATIONS

Harrison et al. "Laser sintered PbSe semiconductor thin films for Mid-IR applications using nanocrystals" Elsevier Journal of Alloys and Compounds vol. 849 (Year: 2020).*

Murali et al. "Characteristics of Slurry Coated Lead Selenide Films" Chalcogenide Letters vol. 6, No. 3 pp. 91-95 (Year: 2009).*

"Written Opinion of the International Searching Authority (Form PCT/ISA/237) of PCT/CN2021/082884," dated Dec. 8, 2021, with English translation thereof, pp. 1-6.

* cited by examiner

LAYERED POLYCRYSTALLINE LEAD SELENIDE PHOTOELECTRIC FILM AND FABRICATION METHOD THEREOF

CROSS-REFERENCE TO RELATED APPLICATION

This application is a 371 application of International PCT application serial no. PCT/CN2021/082884, filed on Mar. 25, 2021, which claims the priority benefit of Chinese application no. 202110302121.1, filed on Mar. 22, 2021. The entirety of each of the above-mentioned patent applications is hereby incorporated by reference herein and made a part of this specification.

TECHNICAL FIELD

The present invention relates to a photoelectric film and a fabrication method thereof, and in particular to a layered polycrystalline lead selenide photoelectric film with high light absorption and low band gap, and a fabrication method thereof. The photoelectric film can be used in the fabrication of components in the field of photoelectric conversion or thermoelectric conversion, such as infrared (IR) sensors, solar cells, laser emitters, and thermoelectric converters.

BACKGROUND

IR radiation interacts with photons to produce some photoelectric effects, such as photoconductive, photovoltaic, photoelectromagnetic, Dember, and photon-drag effects. Photoconductive detectors are essentially resistors sensitive to IR radiation, which are divided into cooled photoconductive detectors and uncooled photoconductive detectors according to whether cooling is required. Uncooled photoconductive detectors are widely studied and used due to their advantages such as simple structure, low manufacturing cost, long life span, stable performance, and high integration degree, and have become the mainstay of civilian IR sensors. A photoelectric film is one of the key components in photoconductive detection, and at present, main materials for photoelectric films include lead sulfide (PbS), lead selenide (PbSe), lead telluride (PbTe), cadmium telluride (CdTe), and the like. The PbSe photoelectric films show high reliability and sensitivity in the mid-IR range, and thus is widely used in fields such as industrial temperature measurement, military guidance, agricultural inspection, astronomical observation.

At present, methods for fabricating PbSe photoconductive detector films mainly include: electrochemical deposition, magnetron sputtering, molecular beam epitaxy (MBE), thermal evaporation, microwave, photochemistry, and chemical bath deposition (CBD), where the CBD has become one of the important technologies drawing attention due to advantages such as simple production equipment, high production efficiency, adaptability to substrates of different types and shapes, low deposition temperature, and simple doping. For example, in "Yao Guansheng et al., Fabrication and Photoelectric Performance Analysis of Short-wave Infrared (IR) Nano-PbSe Film, Aero Weaponry, 20011, 3: 17-27.", quartz is used as a substrate and selenourea ($NH_2CSeNH_2$), lead acetate ($Pb(AC)_2$), and hydrazine ($N_2H_4$) are used as raw materials to fabricate a polycrystalline PbSe film by conducting CBD at room temperature for 90 min. Compared with the present invention, the polycrystalline PbSe film does not have a layered structure, and has a PbSe crystal grain size only of 10 nm, which is 1 to 2 orders of magnitude different from a size of PbSe crystal grains in a dense layer and a loose layer of the present invention. Severe blueshift occurs due to quantum size effects (QSEs), which leads to an increase in a band gap. Moreover, the fabrication method of the film does not involve an ion exchange process. For example, in Chinese patent 201510199477.1 "Mid-infrared (IR) detector and Fabrication Method thereof", potassium hydroxide (KOH), sodium selenosulfate ($Na_2SeSO_3$), and lead acetate ($Pb(AC)_2$) are used as raw materials to form a PbSe film through CBD, and then the PbSe film is processed into a PbSe IR detector through annealing, passivation protection, and packaging processes. Compared with the present invention, the film does not include a loose layer, that is, does not have a layered structure. Moreover, the fabrication method of the film does not involve an ion exchange process. For example, in "Hone F G, et al., The effect of deposition time on the structural, morphological and optical band gap of lead selenide thin films synthesized by chemical bath deposition method. Materials Letters, 2015, 155: 58-61.", $Pb(AC)_2$, $Na_2SeSO_3$, sodium hydroxide (NaOH), and ammonia water ($NH_4OH$) are used as raw materials to fabricate a nanocrystalline PbSe film on a quartz glass substrate through CBD at a temperature of 90° C. and a pH of 12. Compared with the present invention, the film does not have a layered structure, and has a PbSe crystal grain size much smaller than that of the dense layer and the loose layer of the present invention, imperfectly-developed cubic crystal grains with a large number of irregular crystal grains, and an optical band gap of 1.11 eV much larger than that of the present invention. Moreover, the fabrication method of the film does not involve an ion exchange process. For example, in "Ghobadi N, et al., Nanoparticle shape and optical band gap alteration in PbSe nanostructure thin films with deposition temperature controlling. Synthesis and Reactivity in Inorganic and Metal-Organic Chemistry, 2015, 45: 1407-1411.", a PbSe film is deposited on ordinary glass through CBD, where a shape and an optical band gap of the film are changed by changing a deposition temperature. Compared with the present invention, the film does not have a layered structure, has a large number of cracks, poor smoothness, and poor crystallinity of PbSe, will show a sharp drop in absorbance at a wavelength of 400 nm, and has a minimum optical band gap of 1.2 eV much larger than that of the present invention. Moreover, the fabrication method of the film does not involve an ion exchange process. For example, in "Hone F G, et al., The effect of deposition temperature on the structural, morphological and optical band gap of lead selenide thin films synthesized by chemical bath deposition method. Materials Chemistry and Physics, 2016, 1-6.", polycrystalline PbSe films are fabricated on silica glass through CBD at 60° C., 75° C., and 90° C., respectively. Compared with the present invention, the films do not have a layered structure and have irregular crystal grains with different sizes, and the sample fabricated at 90° C. has an optical band gap of 1.13 eV, which is much larger than that of the present invention. Moreover, the fabrication method of the films does not involve an ion exchange process. For example, in "Kale R B, et al., Room temperature chemical synthesis of lead selenide thin films with preferred orientation. Applied Surface Science, 2006, 253: 930-936.", $Pb(AC)_2$, $Na_2SeSO_3$, and $NH_4OH$ are used as raw materials to fabricate a polycrystalline PbSe film by conducting CBD at room temperature for 28 h. Compared with the present invention, the film does not have a layered structure, requires a long reaction time, and has a cubic crystal grain size of about 350 nm smaller than a crystal grain size of the dense layer of the present invention.

Moreover, the fabrication method of the film does not involve an ion exchange process. For example, in "Karper A, Amorphous PbSe thin film produced by chemical bath deposition at pH of 5-8. Surface Review and Letters, 2019, 1950128: 1-5.", the PbSe films are fabricated by conducting CBD at room temperature for 12 h under slightly alkaline, neutral, and slightly acidic conditions, respectively. Compared with the present invention, the films do not have a layered structure, are composed of amorphous platy PbSe, have a reflectivity of less than 20% and an absorbance of less than 0.4 within a wavelength range of 400 nm to 1,000 nm, and have a minimum optical band gap of 1.46 eV much larger than that of the present invention. Moreover, the fabrication method of the films does not involve an ion exchange process. For example, in "Zhu Y, et al., P-type PbSe nanocrystalline films fabricated using high concentration of ammonia as complexing agent, Materials letters, 2020, 281: 128621", high-concentration $NH_4OH$, $Pb(AC)_2$, and $Na_2SeSO_3$ are used as raw materials to fabricate a P-type polycrystalline PbSe film through CBD at room temperature. Compared with the present invention, the film does not have a layered structure, and has a crystal grain size of 70 nm to 160 nm much smaller than the crystal grain size of the dense layer of the present invention, and an optical band gap of 1.36 eV much larger than that of the present invention. Moreover, the fabrication method of the film does not involve an ion exchange process.

A plumbonacrite ($Pb_{10}O(OH)_6(CO_3)_6$) layer is used as a precursor layer for fabricating a PbSe loose layer, and a fabrication process and structure thereof determine the structure and performance of the loose layer. At present, the $Pb_{10}O(OH)_6(CO_3)_6$ layers are mostly fabricated by UV-irradiation CBD and chemical processes, resulting in the formation of the structure composed of vertically connected hexagonal sheets. For example, in "Mendivil-Reynoso T, et al., Synthetic plumbonacrite thin films grown by chemical bath deposition technique. Chalcogenide Letters, 2013, 10: 11-17.", $Pb(AC)_2$, NaOH, triethanolamine (TEA), sodium formaldehyde sulfoxylate (SFS)-sodium hydroxide, and ammonia water/ammonium chloride are used as raw materials to fabricate a plumbonacrite film with a hexagonal structure and an optical band gap of 1.8 eV through CBD. Compared with the present invention, the SFS among the fabrication raw materials has serious toxicity, and the film fabricated is not formed by the stacking of pastry-like crystals. For example, in "Urbiola I R C, et al., Lead Telluride through transformation of plumbonacrite in tellurium atmosphere and its behavior as part of PbTe—Si photodiode. IEEE Sensors Journal, 2016, 16(15): 1-1.", $Pb(AC)_2$, sodium citrate ($C_6H_5Na_3O_7$), potassium hydroxide (KOH), and deionized water are added successively, and then CBD is conducted under UV irradiation to obtain a $Pb_{10}O(OH)_6(CO_3)_6$ film that can be used for a chemical vapor deposition (CVD) reaction. Compared with the present invention, the process is cumbersome, and the $Pb_{10}O(OH)_6(CO_3)_6$ film is formed by the close stacking of platy crystals and does not have a large number of pores, and thus it is impossible to fabricate a loose film subsequently through an ion exchange technology.

A PbSe film can be fabricated by an ion exchange technology. Generally, the crystal grain shape and distribution of a PbSe film are determined by the structure and performance of a precursor layer, an immersion time, and a concentration of an ion exchange solution. For example, in "Samaniego-Benitez J E, et al., Thermal transformation of plumbonacrite/Si films into microstructured Pb/Si ones. Materials Letters, 2017, 198: 38-41.", $Pb(AC)_2$, $C_6H_5Na_3O_7$, and KOH are used as raw materials to fabricate a $Pb_{10}O(OH)_6(CO_3)_6$ film through CBD under UV irradiation, and then the film is subjected to annealing at 700° C. for 1 h in a nitrogen atmosphere and then placed in a selenium ion solution to form PbSe. Compared with the present invention, the processes for preparing $Pb_{10}O(OH)_6(CO_3)_6$ and PbSe is more complicated, a crystal shape of the $Pb_{10}O(OH)_6(CO_3)_6$ is not pastry-like, and the cubic PbSe crystal grains will agglomerate with lead crystal grains into a spherical shape, and include a large amount of impurity lead. For example, in "Heredia-Cancino J A, et al., Optical and structural properties of PbSe films obtained by ionic exchange of lead oxyhydroxicarbonate in a selenium-rongalite solution. Materials Science in Semiconductor Processing, 2016, 56: 90-93.", $Pb(AC)_2$, NaOH, and TEA are used as raw materials to fabricate a dense $Pb_{10}O(OH)_6(CO_3)_6$ film with cross-vertically arranged hexagonal crystals through CBD, and then the film is immersed in a selenium ion solution prepared from a selenium powder (Se), $C_6H_5Na_3O_7$, and SFS to fabricate a PbSe film through an ion exchange reaction. Compared with the present invention, the SFS used has serious toxicity, a large number of impurity phases appear in the film, and no obvious cubic PbSe crystal grains can be seen. For example, in "Mendivil-Reynoso T, et al., PbSe films by ion exchange of synthetic plumbonacrite layers immersed in a selenium ionic solution. Journal of Crystal Growth, 2016, 443: 20-24.", $Pb(AC)_2$, NaOH, TEA, and SFS-ammonia water are used as raw materials to fabricate a $Pb_{10}O(OH)_6(CO_3)_6$ film with cross-vertically arranged hexagonal structures through CBD, and then the film is immersed in a $Na_2SeSO_3$ solution to fabricate a PbSe film through ion exchange. Compared with the present invention, the SFS used has serious toxic and side effects on the human body, and no clear cubic PbSe crystal grains can be seen.

In summary, compared with a product of the present invention, the products in the above documents and patents all do not have a layered film structure (that is, a loose small-crystal grain cubic PbSe layer is formed on a dense large-crystal grain cubic PbSe layer) except for the difference in fabrication materials and process parameters of a dense PbSe layer, a $Pb_{10}O(OH)_6(CO_3)_6$ layer, and a loose PbSe layer. Such a layered film structure can greatly reduce the strong reflection at an interface when light is incident on a PbSe film from the air. Moreover, the film with such a structure has a low band gap due to few defects and large crystal grains, and thus can be better applied in a wide range of light wavelengths.

SUMMARY

In view of the above problems in the prior art, the present invention provides a layered polycrystalline PbSe photoelectric film and a fabrication method thereof. In the film, a loose PbSe layer is formed on the basis of a dense PbSe film, which can greatly alleviate the light reflection at an interface between the air and the PbSe film, improve the light absorption of the PbSe film, enhance the photoconductive effect of the PbSe film, and significantly reduce a band gap of the PbSe film.

To achieve the above objective, the present invention adopts the following specific technical solutions.

A layered polycrystalline PbSe photoelectric film is provided, including a substrate and a PbSe film layer, where the PbSe film layer is composed of a dense PbSe layer on the substrate and a loose PbSe layer on the dense PbSe layer. The dense PbSe layer is formed by close arrangement and stacking of cubic crystal grains with a grain size of 0.7 μm to 1.5 μm, and has a thickness of 1.5 μm to 5 μm. The loose PbSe layer is formed by random arrangement and stacking of cubic crystal grains with a grain size of 0.2 μm to 0.5 μm, and has a large number of micron-scale or submicron-scale voids among crystal grain stacks and among crystal grains, and the loose PbSe layer has a thickness of 5 μm to 15 μm.

Further, the substrate is one selected from the group consisting of glass, silicon, silica, gallium nitride, steel, and quartz.

A fabrication method of the layered polycrystalline PbSe photoelectric film described above is provided, mainly including the following steps:

(1) substrate cleaning:

washing the substrate successively in deionized water, a sulfuric acid-hydrogen peroxide solution, deionized water, and absolute ethanol for 5 min, 10 min, 5 min, and 5 min, respectively, blow-drying the substrate with nitrogen, and storing the substrate;

(2) fabrication of the dense PbSe layer through CBD:

adding a $Pb(AC)_2$ solution with a concentration of 0.3 mol/L to 0.6 mol/L dropwise to a KOH solution with a concentration of 0.45 mol/L to 1.1 mol/L to allow a complete reaction under stirring at 600 rpm, adding a $Na_2SeSO_3$ solution with a concentration of 0.2 mol/L to 0.6 mol/L dropwise, and thoroughly stirring to obtain a yellow-brown suspension, where the KOH solution, the $Pb(AC)_2$ solution, and the $Na_2SeSO_3$ solution have a volume ratio of (2-4):1:1;

placing the yellow-brown suspension in a 60° C. to 85° C. water bath, vertically inserting the substrate obtained in step (1) into the yellow-brown suspension thermally stabilized in the water bath, with one side of the substrate exposed through a mold, and conducting deposition for 3 h to 5 h to form the dense PbSe layer on the substrate;

(3) fabrication of a $Pb_{10}O(OH)_6(CO_3)_6$ layer through CBD:

pouring a $C_6H_5Na_3O_7$ solution with a concentration of 0.2 mol/L to 0.3 mol/L into a $Pb(AC)_2$ solution with a concentration of 0.0164 mol/L to 0.0306 mol/L, stirring with a glass rod to obtain a milky white colloid, adding 28 wt % $NH_4OH$, and stirring to obtain a clear solution, where the $Pb(AC)_2$ solution, the $C_6H_5Na_3O_7$ solution, and the 28 wt % $NH_4OH$ have a volume ratio of (9.8-12.2):(2.8-3.2):(0.8-1.2);

placing the clear solution in a 20° C. to 50° C. water bath, vertically inserting the substrate on which the dense PbSe layer is deposited into the clear solution thermally stabilized in the water bath, with one side of the substrate exposed through a mold, and conducting deposition for 8 h to 24 h to form the $Pb_{10}O(OH)_6(CO_3)_6$ layer on the dense PbSe layer; and (4) fabrication of the loose PbSe layer through ion exchange:

immersing the substrate with the dense PbSe layer and the $Pb_{10}O(OH)_6(CO_3)_6$ layer obtained in step (3) in a selenium ion-containing solution to allow an ion exchange reaction at 20° C. to 40° C. for 0.5 h to 5 h, such that the $Pb_{10}O(OH)_6(CO_3)_6$ layer is transformed into the loose PbSe layer.

Further, the selenium ion-containing solution includes one or a combination of two selected from the group consisting of $Na_2SeSO_3$ and $NH_2CSeNH_2$ at 0.01 mol/L to 0.1 mol/L.

Compared with the existing polycrystalline PbSe photoelectric films, the photoelectric film of the present invention has the following beneficial effects: (1) The layered polycrystalline PbSe film structure composed of a dense PbSe layer and a loose PbSe layer can greatly reduce the strong reflection at an interface when UV, mid-infrared (MIR), and near-infrared (NIR) light is incident on the PbSe film from the air, which helps to improve the absorbance of the film in a wide light wavelength range. (2) The film has few cubic crystal defects and a large crystal grain size, which helps to reduce a band gap of the PbSe film. (3) The $Pb_{10}O(OH)_6(CO_3)_6$ precursor layer has a special "pastry-like" loosely-arranged structure, which facilitates the subsequent formation of a loose PbSe layer through an ion exchange process. (4) The fabrication method of the PbSe film involves simple process, low cost, high controllability, and relatively environmentally-friendly raw materials, and is suitable for large-scale production, and the PbSe film fabricated can be widely used in the fabrication of components in the field of photoelectric conversion or thermoelectric conversion, such as IR sensors, solar cells, laser emitters, and thermoelectric converters.

BRIEF DESCRIPTION OF THE DRAWINGS

The accompanying drawings constituting a part of the present invention provide further understanding of the present invention. Schematic embodiments of the present invention and description thereof are intended to illustrate the present invention and do not constitute an undue limitation on the present invention.

FIG. 2d is a schematic structural diagram of the layered polycrystalline PbSe photoelectric film.

DETAILED DESCRIPTION OF THE EMBODIMENTS

Figure 1:
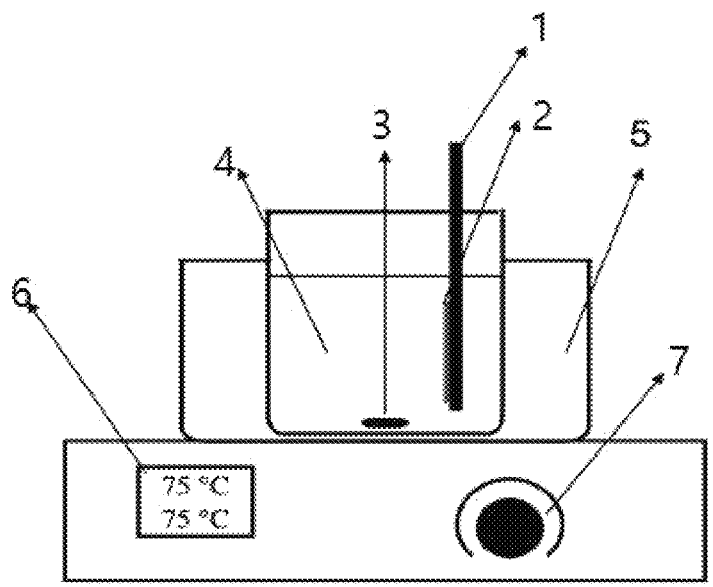
FIG. 1 is a schematic diagram of a CBD device for fabricating the layered polycrystalline PbSe photoelectric film according to the present invention, where 1 represents a mold; 2 represents a substrate; 3 represents a magnetic stirring bar; 4 represents a reaction solution; 5 represents silicone oil; 6 represents temperature adjustment and display; and 7 represents speed adjustment.
Figure 2:
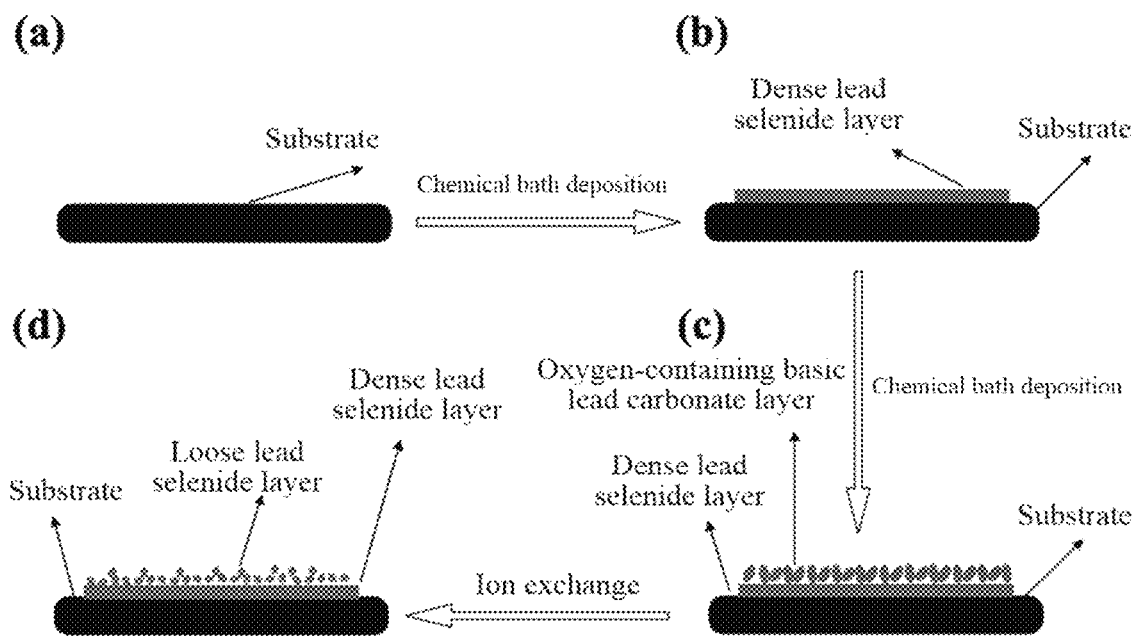
FIG. 2 is a flow chart of the fabrication method of the layered polycrystalline PbSe photoelectric film according to the present invention, where
Figure 3:
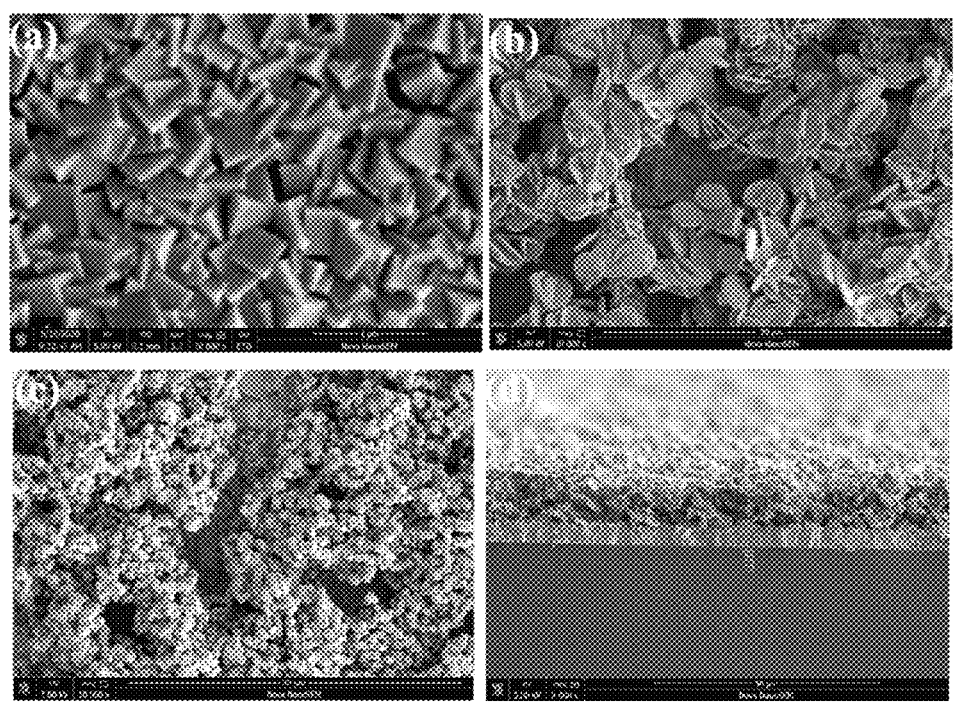
FIG. 3 shows scanning electron microscopy (SEM) images of a typical sample of the layered polycrystalline PbSe film fabricated in the present invention, where (a) shows a surface of the dense PbSe layer, (b) shows a surface of the $Pb_{10}O(OH)_6(CO_3)_6$ layer, (c) shows a surface of the loose PbSe layer, and (d) shows a cross section of the layered polycrystalline PbSe film.
Figure 4:
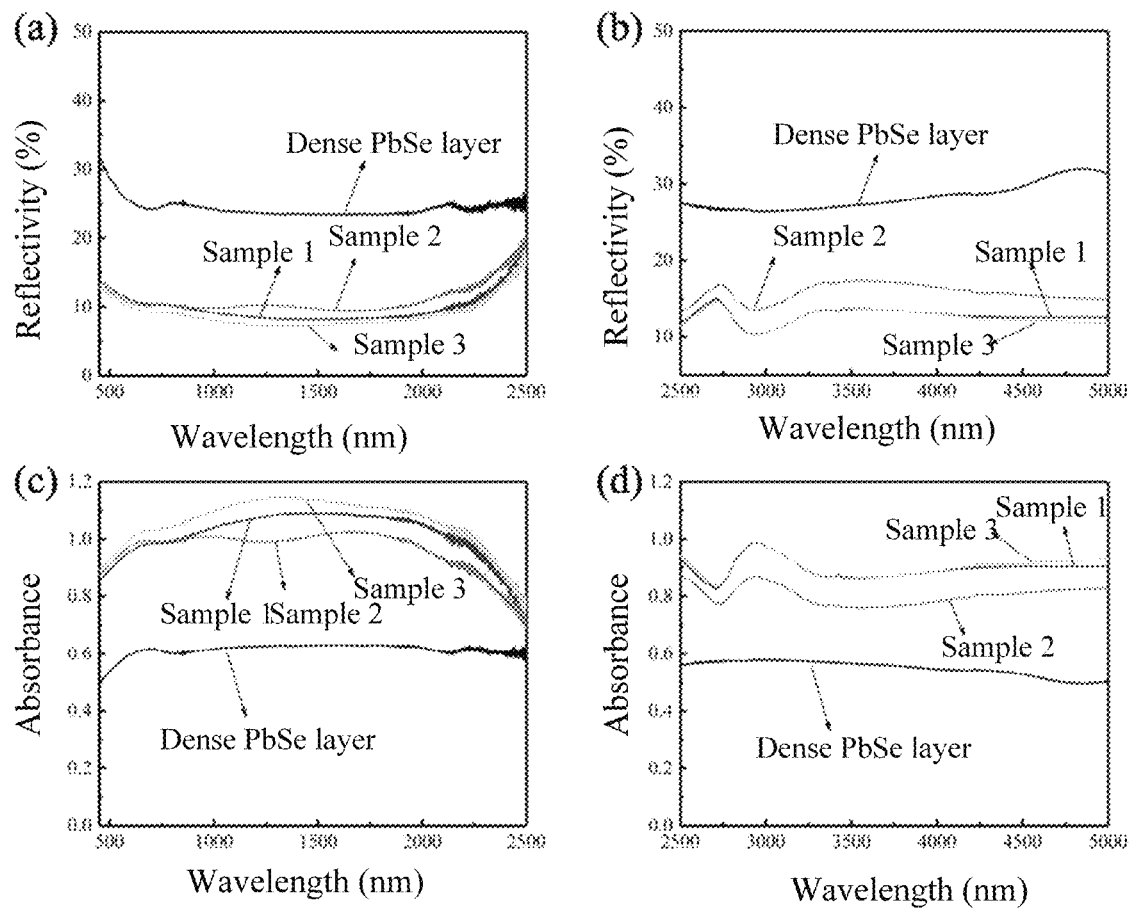
FIG. 4 shows reflection and absorption spectra of typical samples of the layered polycrystalline PbSe film fabricated in the present invention, where (a) shows reflection spectra in a wavelength range of 450 nm to 2,500 nm; (b) shows reflection spectra in a wavelength range of 2,500 nm to 5,000 nm; (c) shows absorption spectra in a wavelength range of 450 nm to 2,500 nm; (d) shows absorption spectra in a wavelength range of 2,500 nm to 5,000 nm; and the layered polycrystalline PbSe film has an average absorbance of 0.89 to 1.31 and an average optical reflectivity of 8.58% to 13.63% in the wavelength range of 450 nm to 5,000 nm.
Figure 5:
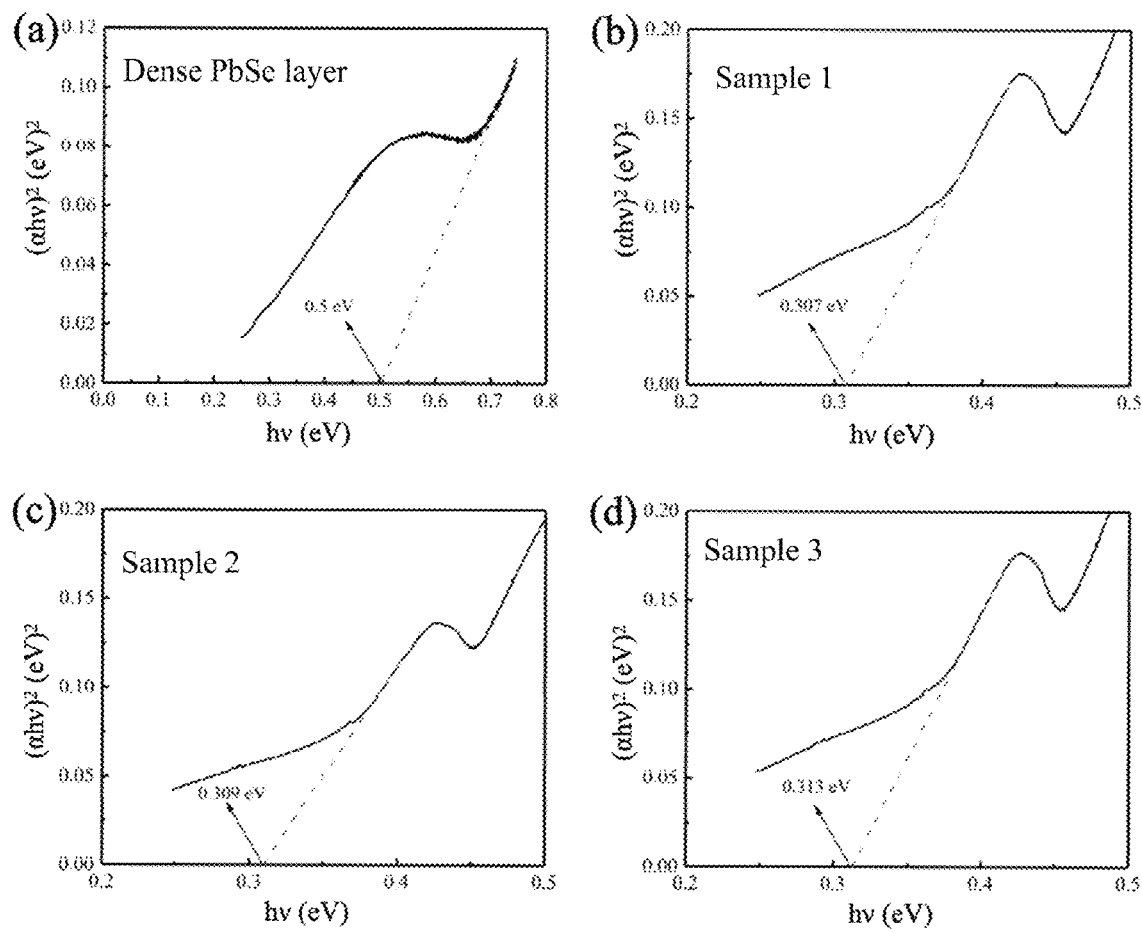
FIG. 5 shows optical band gaps of typical samples of the layered polycrystalline PbSe film fabricated in the present invention, where (a) is for a dense PbSe layer, (b) is for sample 1, (c) is for sample 2, and (d) is for sample 3; and the layered polycrystalline PbSe film has a band gap of 0.30 eV to 0.32 eV.

In order to further illustrate the technical solutions of the present invention and characteristics thereof, the layered polycrystalline PbSe photoelectric film and the fabrication method thereof proposed according to the present invention are further described below in conjunction with FIG. 1, FIG. 2, FIG. 3, FIG. 4, FIG. 5, and typical implementation examples, and fabrication steps include: (1) substrate cleaning; (2) fabrication of a dense PbSe layer through CBD; (3) fabrication of a $Pb_{10}O(OH)_6(CO_3)_6$ layer through CBD; and (4) fabrication of a loose PbSe layer through ion exchange. It should be noted that the described specific examples are merely used to explain the present invention and are not intended to limit the present invention.

Detailed description is as follows.

Example 1

(1) A two-inch glass wafer substrate was washed successively in deionized water, a sulfuric acid-hydrogen peroxide solution, deionized water, and absolute ethanol for 5 min, 10 min, 5 min, and 5 min respectively, blow-dried with nitrogen, and stored.

(2) A $Pb(AC)_2$ solution with a concentration of 0.45 mol/L was added dropwise to a KOH solution with a concentration of 0.667 mol/L to allow a complete reaction under stirring at 600 rpm, then a $Na_2SeSO_3$ solution with a concentration of 0.56 mol/L was added dropwise, and a resulting mixture was thoroughly stirred to obtain a yellow-brown suspension, where the KOH solution, the $Pb(AC)_2$ solution, and the $Na_2SeSO_3$ solution had a volume ratio of 3:1:1.

The 4.62 g of a selenium powder (Se) and 14.749 g of anhydrous sodium sulfite ($Na_2SO_3$) (a molar ratio of the Se to the $Na_2SO_3$ was 1:2) were weighed and added to 105 ml of deionized water, a resulting mixture was subjected to reflux at 85° C. for 3 h, and insoluble impurities were filtered out to obtain a clear and transparent $Na_2SeSO_3$ solution with a concentration of 0.56 mol/L.

The yellow-brown suspension was placed in a 75° C. water bath, the substrate obtained in step (1) was vertically inserted into the yellow-brown suspension thermally stabilized in the water bath, with one side of the substrate exposed through a mold, and deposition was conducted for 4 h to form a dense PbSe layer on the substrate.

The dense PbSe layer fabricated by this process had a crystal grain size of 0.98 μm and a thickness of 2.4 μm. In the present invention, the sample was named a dense PbSe layer, its surface morphology was shown in FIG. 3a, and the optical reflection, optical absorption, and band gap of the dense PbSe layer were shown in FIG. 4 and FIG. 5. The dense PbSe layer had an optical reflectivity of about 24.37% in a range of 450 nm to 2,500 nm and about 28.26% in a range of 2,500 nm to 5,000 nm, an optical absorbance of about 0.61 in a range of 450 nm to 2,500 nm and about 0.55 in a range of 2,500 nm to 5,000 nm, and a band gap of about 0.5 eV.

(3) A $C_6H_5Na_3O_7$ solution with a concentration of 0.2 mol/L was poured into a $Pb(AC)_2$ solution with a concentration of 0.1812 mol/L, a resulting mixture was stirred with a glass rod to obtain a milky white colloid, 28 wt % $NH_4OH$ was added, and a resulting mixture was stirred to obtain a clear solution, where the $Pb(AC)_2$ solution, the $C_6H_5Na_3O_7$ solution, and the 28 wt % $NH_4OH$ had a volume ratio of 11:3:1.

The clear solution was placed in a 25° C. water bath, the substrate on which the dense PbSe layer was deposited was vertically inserted into the clear solution thermally stabilized in the water bath, with one side of the substrate exposed through a mold, and deposition was conducted for 9 h to form a $Pb_{10}O(OH)_6(CO_3)_6$ layer on the dense PbSe layer.

The surface morphology of the $Pb_{10}O(OH)_6(CO_3)_6$ layer fabricated on the dense PbSe layer was shown in FIG. 3b.

(4) The substrate with the dense PbSe layer and the $Pb_{10}O(OH)_6(CO_3)_6$ layer obtained in step (3) was placed in a $Na_2SeSO_3$ solution with a concentration of 0.026 mol/L to allow an ion exchange reaction at 25° C. for 2 h, such that the $Pb_{10}O(OH)_6(CO_3)_6$ layer was transformed into the loose PbSe layer.

The layered polycrystalline PbSe film with high light absorption and low band gap fabricated by this process was named "Sample 1" in the present invention, where a loose PbSe layer had a crystal grain size of about 0.42 μm and a thickness of about 5.2 μm, and a surface morphology thereof was shown in FIG. 3c. The optical reflection, optical absorption, and band gap of Sample 1 were shown in FIG. 4 and FIG. 5, and the results showed that, compared with the dense PbSe layer, Sample 1 had an optical reflectivity reduced by 59.62% in a range of 450 nm to 2,500 nm and reduced by 55.01% in a range of 2,500 nm to 5,000 nm, and an optical absorbance increased by 65.34% in a range of 450 nm to 2,500 nm and increased by 63.24% in a range of 2,500 nm to 5,000 nm. Sample 1 had an average absorbance of 0.95 and an average optical reflectivity of about 11.41% in a wavelength range of 450 nm to 5,000 nm, and a band gap reduced from about 0.5 eV to 0.307 eV.

Example 2

(1) A two-inch glass wafer substrate was washed successively in deionized water, a sulfuric acid-hydrogen peroxide solution, deionized water, and absolute ethanol for 5 min, 10 min, 5 min, and 5 min respectively, blow-dried with nitrogen, and stored.

(2) A $Pb(AC)_2$ solution with a concentration of 0.45 mol/L was added dropwise to a KOH solution with a concentration of 0.667 mol/L to allow a complete reaction under stirring at 600 rpm, then a $Na_2SeSO_3$ solution with a concentration of 0.56 mol/L was added dropwise, and a resulting mixture was thoroughly stirred to obtain a yellow-brown suspension, where the KOH solution, the $Pb(AC)_2$ solution, and the $Na_2SeSO_3$ solution had a volume ratio of 3:1:1.

The yellow-brown suspension was placed in a 75° C. water bath, the substrate obtained in step (1) was vertically inserted into the yellow-brown suspension thermally stabilized in the water bath, with one side of the substrate exposed through a mold, and deposition was conducted for 4 h to form a dense PbSe layer on the substrate.

(3) A $C_6H_5Na_3O_7$ solution with a concentration of 0.2 mol/L was poured into a $Pb(AC)_2$ solution with a concentration of 0.1812 mol/L, a resulting mixture was stirred with a glass rod to obtain a milky white colloid, 28 wt % $NH_4OH$ was added, and a resulting mixture was stirred to obtain a clear solution, where the $Pb(AC)_2$ solution, the $C_6H_5Na_3O_7$ solution, and the 28 wt % $NH_4OH$ had a volume ratio of 11:3:1.

The clear solution was placed in a 25° C. water bath, the substrate on which the dense PbSe layer was deposited was vertically inserted into the clear solution thermally stabilized in the water bath, with one side of the substrate exposed through a mold, and deposition was conducted for 8 h to form a $Pb_{10}O(OH)_6(CO_3)_6$ layer on the dense PbSe layer.

(4) The substrate with the dense PbSe layer and the $Pb_{10}O(OH)_6(CO_3)_6$ layer obtained in step (3) was placed in a $Na_2SeSO_3$ solution with a concentration of 0.026 mol/L to allow an ion exchange reaction at 25° C. for 1 h, such that the $Pb_{10}O(OH)_6(CO_3)_6$ layer was transformed into the loose PbSe layer.

The layered polycrystalline PbSe film with high light absorption and low band gap fabricated by this process was named "Sample 2" in the present invention, where a loose PbSe layer had a crystal grain size of about 0.2 m and a thickness of about 6.1 μm. The optical reflection, optical absorption, and band gap of Sample 2 were shown in FIG. 4 and FIG. 5, and the results showed that, compared with the dense PbSe layer, Sample 2 had an optical reflectivity reduced by 54.74% in a range of 450 nm to 2,500 nm and reduced by 44.09% in a range of 2,500 nm to 5,000 nm, and an optical absorbance increased by 57.07% in a range of 450 nm to 2,500 nm and increased by 46.2% in a range of 2,500 nm to 5,000 nm. Sample 2 had an average absorbance of 0.89 and an average optical reflectivity of about 13.63% in a wavelength range of 450 nm to 5,000 nm, and a band gap reduced from about 0.5 eV to 0.309 eV.

Example 3

(1) A two-inch glass wafer substrate was washed successively in deionized water, a sulfuric acid-hydrogen peroxide solution, deionized water, and absolute ethanol for 5 min, 10 min, 5 min, and 5 min respectively, blow-dried with nitrogen, and stored.

(2) A $Pb(AC)_2$ solution with a concentration of 0.45 mol/L was added dropwise to a KOH solution with a concentration of 0.667 mol/L to allow a complete reaction under stirring at 600 rpm, then a $Na_2SeSO_3$ solution with a concentration of 0.56 mol/L was added dropwise, and a resulting mixture was thoroughly stirred to obtain a yellow-brown suspension, where the KOH solution, the $Pb(AC)_2$ solution, and the $Na_2SeSO_3$ solution had a volume ratio of 3:1:1.

The yellow-brown suspension was placed in a 75° C. water bath, the substrate obtained in step (1) was vertically inserted into the yellow-brown suspension thermally stabilized in the water bath, with one side of the substrate exposed through a mold, and deposition was conducted for 4 h to form a dense PbSe layer on the substrate.

(3) A $C_6H_5Na_3O_7$ solution with a concentration of 0.2 mol/L was poured into a $Pb(AC)_2$ solution with a concentration of 0.1812 mol/L, a resulting mixture was stirred with a glass rod to obtain a milky white colloid, 28 wt % $NH_4OH$ was added, and a resulting mixture was stirred to obtain a clear solution, where the $Pb(AC)_2$ solution, the $C_6H_5Na_3O_7$ solution, and the 28 wt % $NH_4OH$ had a volume ratio of 11:3:1.

The clear solution was placed in a 25° C. water bath, the substrate on which the dense PbSe layer was deposited was vertically inserted into the clear solution thermally stabilized in the water bath, with one side of the substrate exposed through a mold, and deposition was conducted for 8 h to form a $Pb_{10}O(OH)_6(CO_3)_6$ layer on the dense PbSe layer.

(4) The substrate with the dense PbSe layer and the $Pb_{10}O(OH)_6(CO_3)_6$ layer obtained in step (3) was placed in a $Na_2SeSO_3$ solution with a concentration of 0.026 mol/L to allow an ion exchange reaction at 25° C. for 2 h, such that the $Pb_{10}O(OH)_6(CO_3)_6$ layer was transformed into the loose PbSe layer.

The layered polycrystalline PbSe film with high light absorption and low band gap fabricated by this process was named "Sample 3" in the present invention, where a loose PbSe layer had a crystal grain size of about 0.38 μm and a thickness of about 6.4 μm. The optical reflection, optical absorption, and band gap of Sample 3 were shown in FIG. 4 and FIG. 5, and the results showed that, compared with the dense PbSe layer, Sample 3 had an optical reflectivity reduced by about 63.3% in a range of 450 nm to 2,500 nm and reduced by 55.64% in a range of 2,500 nm to 5,000 nm, and an optical absorbance increased by 72.46% in a range of 450 nm to 2,500 nm and increased by 64.42% in a range of 2,500 nm to 5,000 nm. Sample 3 had an average absorbance of 0.97 and an average optical reflectivity of about 10.91% in a wavelength range of 450 nm to 5,000 nm, and a band gap reduced from about 0.5 eV to 0.313 eV.

Example 4

(1) A two-inch polycrystalline silicon substrate was washed successively in deionized water, a sulfuric acid-hydrogen peroxide solution, deionized water, and absolute ethanol for 5 min, 10 min, 5 min, and 5 min respectively, blow-dried with nitrogen, and stored.

(2) A $Pb(AC)_2$ solution with a concentration of 0.3 mol/L was added dropwise to a KOH solution with a concentration of 0.45 mol/L to allow a complete reaction under stirring at 600 rpm, then a $Na_2SeSO_3$ solution with a concentration of 0.2 mol/L was added dropwise, and a resulting mixture was thoroughly stirred to obtain a yellow-brown suspension, where the KOH solution, the $Pb(AC)_2$ solution, and the $Na_2SeSO_3$ solution had a volume ratio of 4:1:1.

The yellow-brown suspension was placed in a 60° C. water bath, the substrate obtained in step (1) was vertically inserted into the yellow-brown suspension thermally stabilized in the water bath, with one side of the substrate exposed through a mold, and deposition was conducted for 3 h to form a dense PbSe layer on the substrate.

The dense PbSe layer had a crystal grain size of about 0.7 μm and a thickness of about 1.5 μm.

(3) A $C_6H_5Na_3O_7$ solution with a concentration of 0.2 mol/L was poured into a $Pb(AC)_2$ solution with a concentration of 0.0164 mol/L, a resulting mixture was stirred with a glass rod to obtain a milky white colloid, 28 wt % $NH_4OH$ was added, and a resulting mixture was stirred to obtain a clear solution, where the $Pb(AC)_2$ solution, the $C_6H_5Na_3O_7$ solution, and the 28 wt % $NH_4OH$ had a volume ratio of 12.2:2.8:0.8.

The clear solution was placed in a 20° C. water bath, the substrate on which the dense PbSe layer was deposited was vertically inserted into the clear solution thermally stabilized in the water bath, with one side of the substrate exposed through a mold, and deposition was conducted for 10 h to form a $Pb_{10}O(OH)_6(CO_3)_6$ layer on the dense PbSe layer.

(4) The substrate with the dense PbSe layer and the $Pb_{10}O(OH)_6(CO_3)_6$ layer obtained in step (3) was placed in a $Na_2SeSO_3$ solution with a concentration of 0.01 mol/L to allow an ion exchange reaction at 20° C. for 5 h, such that the $Pb_{10}O(OH)_6(CO_3)_6$ layer was transformed into the loose PbSe layer. The loose PbSe layer in the layered polycrystalline PbSe film had a crystal grain size of about 0.2 μm and a thickness of about 5 μm. The sample had an average absorbance of 0.87 and an average optical reflectivity of about 14.43% in a wavelength range of 450 nm to 5,000 nm, and a band gap of about 0.32 eV.

Example 5

(1) A two-inch silica substrate was washed successively in deionized water, a sulfuric acid-hydrogen peroxide solution, deionized water, and absolute ethanol for 5 min, 10 min, 5 min, and 5 min respectively, blow-dried with nitrogen, and stored.

(2) A $Pb(AC)_2$ solution with a concentration of 0.6 mol/L was added dropwise to a KOH solution with a concentration of 1.1 mol/L to allow a complete reaction under stirring at 600 rpm, then a $Na_2SeSO_3$ solution with a concentration of 0.6 mol/L was added dropwise, and a resulting mixture was thoroughly stirred to obtain a yellow-brown suspension, where the KOH solution, the $Pb(AC)_2$ solution, and the $Na_2SeSO_3$ solution had a volume ratio of 2:1:1.

The yellow-brown suspension was placed in an 85° C. water bath, the substrate obtained in step (1) was vertically inserted into the yellow-brown suspension thermally stabilized in the water bath, with one side of the substrate exposed through a mold, and deposition was conducted for 5 h to form a dense PbSe layer on the substrate.

The dense PbSe layer had a crystal grain size of about 1.5 µm and a thickness of about 5 µm.

(3) A $C_6H_5Na_3O_7$ solution with a concentration of 0.3 mol/L was poured into a $Pb(AC)_2$ solution with a concentration of 0.0306 mol/L, a resulting mixture was stirred with a glass rod to obtain a milky white colloid, 28 wt % $NH_4OH$ was added, and a resulting mixture was stirred to obtain a clear solution, where the $Pb(AC)_2$ solution, the $C_6H_5Na_3O_7$ solution, and the 28 wt % $NH_4OH$ had a volume ratio of 9.8:3.2:1.2.

The clear solution was placed in a 50° C. water bath, the substrate on which the dense PbSe layer was deposited was vertically inserted into the clear solution thermally stabilized in the water bath, with one side of the substrate exposed through a mold, and deposition was conducted for 24 h to form a $Pb_{10}O(OH)_6(CO_3)_6$ layer on the dense PbSe layer.

(4) The substrate with the dense PbSe layer and the $Pb_{10}O(OH)_6(CO_3)_6$ layer obtained in step (3) was placed in a mixed selenium ion-containing solution with 0.05 mol/L $Na_2SeSO_3$ and 0.05 mol/L $NH_2CSeNH_2$ to allow an ion exchange reaction at 40° C. for 0.5 h, such that the $Pb_{10}O(OH)_6(CO_3)_6$ layer was transformed into the loose PbSe layer. The loose PbSe layer in the layered polycrystalline PbSe film had a crystal grain size of about 0.5 µm and a thickness of about 15 µm. The sample had an average absorbance of 1.31 and an average optical reflectivity of about 8.58% in a wavelength range of 450 nm to 5,000 nm, and a band gap of about 0.30 eV.

Example 6

(1) A gallium nitride substrate was washed successively in deionized water, a sulfuric acid-hydrogen peroxide solution, deionized water, and absolute ethanol for 5 min, 10 min, 5 min, and 5 min respectively, blow-dried with nitrogen, and stored.

(2) A $Pb(AC)_2$ solution with a concentration of 0.4 mol/L was slowly added dropwise to a KOH solution with a concentration of 1 mol/L to allow a complete reaction under stirring at 600 rpm, then a $Na_2SeSO_3$ solution with a concentration of 0.5 mol/L was added dropwise, and a resulting mixture was thoroughly stirred to obtain a yellow-brown suspension, where the KOH solution, the $Pb(AC)_2$ solution, and the $Na_2SeSO_3$ solution had a volume ratio of 2:1:1.

The yellow-brown suspension was placed in an 80° C. water bath, the substrate obtained in step (1) was vertically inserted into the yellow-brown suspension thermally stabilized in the water bath, with one side of the substrate exposed through a mold, and deposition was conducted for 4 h to form a dense PbSe layer on the substrate.

The dense PbSe layer had a crystal grain size of about 1 µm and a thickness of about 4.45 µm, as shown in FIG. 3d.

(3) A $C_6H_5Na_3O_7$ solution with a concentration of 0.25 mol/L was poured into a $Pb(AC)_2$ solution with a concentration of 0.0229 mol/L, a resulting mixture was stirred with a glass rod to obtain a milky white colloid, 28 wt % $NH_4OH$ was added, and a resulting mixture was stirred to obtain a clear solution, where the $Pb(AC)_2$ solution, the $C_6H_5Na_3O_7$ solution, and the 28 wt % $NH_4OH$ had a volume ratio of 10.9:3:1.

The clear solution was placed in a 40° C. water bath, the substrate on which the dense PbSe layer was deposited was vertically inserted into the clear solution thermally stabilized in the water bath, with one side of the substrate exposed through a mold, and deposition was conducted for 24 h to form a $Pb_{10}O(OH)_6(CO_3)_6$ layer on the dense PbSe layer.

(4) The substrate with the dense PbSe layer and the $Pb_{10}O(OH)_6(CO_3)_6$ layer obtained in step (3) was placed in a solution with 0.05 mol/L $Na_2SeSO_3$ to allow an ion exchange reaction at 35° C. for 2.5 h, such that the $Pb_{10}O(OH)_6(CO_3)_6$ layer was transformed into the loose PbSe layer. The loose PbSe layer in the layered polycrystalline PbSe film with high light absorption and low band gap had a crystal grain size of about 0.42 µm and a thickness of about 15 µm. The sample had an average absorbance of 0.95 and an average optical reflectivity of about 10.65% in a wavelength range of 450 nm to 5,000 nm, and a band gap of about 0.30 eV.

Example 7

(1) A quartz substrate was washed successively in deionized water, a sulfuric acid-hydrogen peroxide solution, deionized water, and absolute ethanol for 5 min, 10 min, 5 min, and 5 min respectively, blow-dried with nitrogen, and stored.

(2) A $Pb(AC)_2$ solution with a concentration of 0.6 mol/L was added dropwise to a KOH solution with a concentration of 0.76 mol/L to allow a complete reaction under stirring at 600 rpm, then a $Na_2SeSO_3$ solution with a concentration of 0.4 mol/L was added dropwise, and a resulting mixture was thoroughly stirred to obtain a yellow-brown suspension, where the KOH solution, the $Pb(AC)_2$ solution, and the $Na_2SeSO_3$ solution had a volume ratio of 2.5:1:1.

The yellow-brown suspension was placed in a 70° C. water bath, the substrate obtained in step (1) was vertically inserted into the yellow-brown suspension thermally stabilized in the water bath, with one side of the substrate exposed through a mold, and deposition was conducted for 3 h to form a dense PbSe layer on the substrate.

The dense PbSe layer had a crystal grain size of about 0.9 µm and a thickness of about 3.1 µm.

(3) A $C_6H_5Na_3O_7$ solution with a concentration of 0.25 mol/L was poured into a $Pb(AC)_2$ solution with a concentration of 0.0283 mol/L, a resulting mixture was stirred with a glass rod to obtain a milky white colloid, 28 wt % $NH_4OH$ was added, and a resulting mixture was stirred to obtain a clear solution, where the $Pb(AC)_2$ solution, the $C_6H_5Na_3O_7$ solution, and the 28 wt % $NH_4OH$ had a volume ratio of 9.9:3:0.9.

The clear solution was placed in a 45° C. water bath, the substrate on which the dense PbSe layer was deposited was vertically inserted into the clear solution thermally stabilized in the water bath, with one side of the substrate exposed through a mold, and deposition was conducted for 15 h to form a $Pb_{10}O(OH)_6(CO_3)_6$ layer on the dense PbSe layer.

(4) The substrate with the dense PbSe layer and the $Pb_{10}O(OH)_6(CO_3)_6$ layer obtained in step (3) was placed in a solution with 0.05 mol/L $NH_2CSeNH_2$ to allow an ion exchange reaction at 40° C. for 2.5 h, such that the $Pb_{10}O(OH)_6(CO_3)_6$ layer was transformed into the loose PbSe layer. The loose PbSe layer in the layered polycrystalline PbSe film had a crystal grain size of about 0.45 µm and a thickness of about 14.6 µm. The sample had an average absorbance of 0.96 and an average optical reflectivity of about 10.92% in a wavelength range of 450 nm to 5,000 nm, and a band gap of about 0.30 eV.

The above are only some typical examples of the present invention, and are not intended to limit the present invention. Any modifications, changes, and transformations of equivalent elements made to the above examples according to the technical essence of the present invention are still within the protection scope of the technical solutions of the present invention.

What is claimed is:

1. A layered polycrystalline lead selenide film, comprising a substrate and a lead selenide film layer, wherein the lead selenide film layer is composed of a dense lead selenide layer on the substrate and a loose lead selenide layer on the dense lead selenide layer; the dense lead selenide layer is formed by close arrangement and stacking of cubic crystal grains with a grain size of 0.7 µm to 1.5 µm, and has a thickness of 1.5 µm to 5 µm; and the loose lead selenide layer is formed by random arrangement and stacking of cubic crystal grains with a grain size of 0.2 µm to 0.5 µm, and has a plurality of micron-scale or submicron-scale voids among crystal grain stacks and among crystal grains, and the loose lead selenide layer has a thickness of 5 µm to 15 µm.

2. The layered polycrystalline lead selenide film according to claim 1, wherein the layered polycrystalline lead selenide film shows an average absorbance of 0.89 to 1.31, and an average optical reflectivity of 8.58% to 13.63% in a wavelength range of 450 nm to 5,000 nm.

3. The layered polycrystalline lead selenide film according to claim 1, wherein the layered polycrystalline lead selenide film has a band gap of 0.30 eV to 0.32 eV.

4. The layered polycrystalline lead selenide film according to claim 1, wherein the substrate is one selected from the group consisting of glass, silicon, silica, gallium nitride, and quartz.

5. A fabrication method of the layered polycrystalline lead selenide film according to claim 1, comprising the following steps:
(1) substrate cleaning;
(2) fabrication of the dense lead selenide layer through chemical bath deposition:
adding a lead acetate solution with a concentration of 0.3 mol/L to 0.6 mol/L dropwise to a potassium hydroxide solution with a concentration of 0.45 mol/L to 1.1 mol/L to allow a complete reaction under stirring, adding a sodium selenosulfate solution with a concentration of 0.2 mol/L to 0.6 mol/L dropwise, and thoroughly stirring to obtain a yellow-brown suspension, wherein the potassium hydroxide solution, the lead acetate solution, and the sodium selenosulfate solution have a volume ratio of (2-4):1:1;

placing the yellow-brown suspension in a 60° C. to 85° C. water bath, vertically inserting the substrate obtained in step (1) into the yellow-brown suspension thermally stabilized in the water bath, with one side of the substrate exposed through a mold, and conducting deposition for 3 h to 5 h to form the dense lead selenide layer on the substrate;
(3) fabrication of a plumbonacrite layer through chemical bath deposition:
pouring a sodium citrate solution with a concentration of 0.2 mol/L to 0.3 mol/L into a lead acetate solution with a concentration of 0.0164 mol/L to 0.0306 mol/L, stirring with a glass rod to obtain a milky white colloid, adding ammonia water, and stirring to obtain a clear solution, wherein the lead acetate solution, the sodium citrate solution, and the ammonia water have a volume ratio of (9.8-12.2):(2.8-3.2):(0.8-1.2);

placing the clear solution in a 20° C. to 50° C. water bath, vertically inserting the substrate on which the dense lead selenide layer is deposited into the clear solution thermally stabilized in the water bath, with one side of the substrate exposed through a mold, and conducting deposition for 8 h to 24 h to form the plumbonacrite layer on the dense lead selenide layer; and
(4) fabrication of the loose lead selenide layer through ion exchange: placing the substrate with the dense lead selenide layer and the plumbonacrite layer obtained in step (3) in a selenium ion-containing solution to allow an ion exchange reaction at 20° C. to 40° C. for 0.5 h to 5 h, such that the plumbonacrite layer is transformed into the loose lead selenide layer.

6. The fabrication method of the layered polycrystalline lead selenide film according to claim 5, wherein in step (1), the substrate cleaning is conducted by washing the substrate successively in deionized water, a sulfuric acid-hydrogen peroxide solution, deionized water, and absolute ethanol for 5 min, 10 min, 5 min, and 5 min, respectively, taking the substrate out, blow-drying the substrate with a nitrogen gun, and then storing the substrate.

7. The fabrication method of the layered polycrystalline lead selenide film according to claim 5, wherein in step (2), the stirring is conducted at a rotational speed of 600 rpm.

8. The fabrication method of the layered polycrystalline lead selenide film according to claim 5, wherein in step (3), the ammonia water has a concentration of 28 wt %.

9. The fabrication method of the layered polycrystalline lead selenide film according to claim 5, wherein in step (4), the selenium ion-containing solution comprises one or a combination of two selected from the group consisting of sodium selenosulfate and selenourea at 0.01 mol/L to 0.1 mol/L.

* * * * *